United States Patent
Tan et al.

(10) Patent No.: US 7,866,224 B2
(45) Date of Patent: Jan. 11, 2011

(54) MONITORING STRUCTURE

(75) Inventors: Sia Kim Tan, Singapore (SG); Gek Soon Chua, Singapore (SG); Qun Ying Lin, Singapore (SG); Martin Yeo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 1004 days.

(21) Appl. No.: 11/565,623

(22) Filed: Nov. 30, 2006

(65) Prior Publication Data
US 2008/0127998 A1 Jun. 5, 2008

(51) Int. Cl.
*B08B 13/00* (2006.01)
(52) U.S. Cl. .................. 73/864.51; 134/34; 134/104.2; 134/113; 134/118
(58) Field of Classification Search ............. 73/864.33, 73/864.51, 104; 134/104.2–104.3, 18, 34, 134/133, 115 R; 430/5, 347
See application file for complete search history.

(56) References Cited

U.S. PATENT DOCUMENTS

| | | | | |
|---|---|---|---|---|
| 3,401,668 A | * | 9/1968 | Welsh et al. | 118/70 |
| 5,454,519 A | * | 10/1995 | Luck | 241/24.14 |
| 6,172,409 B1 | | 1/2001 | Zhou | |
| 6,922,265 B1 | * | 7/2005 | Ozawa et al. | 358/498 |
| 2003/0221620 A1 | * | 12/2003 | Yamazaki | 118/722 |
| 2004/0031442 A1 | * | 2/2004 | Yamazaki et al. | 118/727 |
| 2004/0035360 A1 | * | 2/2004 | Yamazaki et al. | 118/715 |
| 2005/0233225 A1 | | 10/2005 | Ibaragi | |
| 2007/0002516 A1 | * | 1/2007 | Matsumoto | 361/234 |

* cited by examiner

*Primary Examiner*—Thomas P Noland
(74) *Attorney, Agent, or Firm*—Mikio Ishimaru

(57) ABSTRACT

Apparatus is provided for determining presence of contamination on a lithography mask, including: a fluid trap having a base and at least one wall member extending substantially perpendicularly to the base for trapping fluid on a portion of the base when fluid introduced during a cleaning process of the mask is removed.

11 Claims, 9 Drawing Sheets

MONITORING STRUCTURE

1. FIELD OF THE INVENTION

The present invention relates to monitoring structures suitable for placement on photomasks.

2. DESCRIPTION OF THE RELATED ART

Photomasks are commonly used in lithography processes associated with the processing of semiconductor wafers to fabricate integrated circuits (ICs) used in cell phones, music players, and other electronic devices. Photomasks typically consist of a substrate such as a plate of glass or quartz on which a feature pattern is provided representing the circuit features to be transferred to the wafer. The features may be provided on the mask in the form of an opaque and/or partially opaque layer such as evaporated chrome.

As the size of features associated with semiconductor ICs decreases, the size of the corresponding features on the photomask also decreases. Consequently, the yield of working devices resulting from a semiconductor manufacturing process becomes increasingly sensitive to the presence of contaminants on the photomask as the size of the features is reduced.

Contaminants may be introduced onto the surface of photomasks during use of the photomask, storage of the photomask or cleaning of the photomask when the photomasks are to be reused. In the case of contaminants introduced during cleaning, residue from cleaning fluid may be left on the mask following a process of drying of the photomask. The residue may subsequently react and form compounds on the photomask during exposure of the photomask in the lithography process. The compounds may cause deleterious variation in the intensity and/or phase of optical illumination projected through the photomask, resulting in failure to reproduce faithfully the original feature pattern of the photomask.

In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

3. SUMMARY OF THE INVENTION

The present invention provides apparatus for determining presence of contamination on a lithography mask, including a fluid trap having a base and at least one wall member extending substantially perpendicularly to the base for trapping fluid on a portion of the base when fluid introduced during a cleaning process of the mask is removed.

Certain embodiments of the invention have other aspects in addition to or in place of those mentioned above. The aspects will become apparent to those skilled in the art from a reading of the following detailed description when taken with reference to the accompanying drawings.

4. BRIEF DESCRIPTION OF THE DRAWINGS

Embodiments of the present invention will now be described hereinafter, by way of example only, with reference to the accompanying drawings, in which.

5. DETAILED DESCRIPTION OF THE INVENTION

The following embodiments are intended to illustrate the invention more fully without limiting their scope, since numerous modifications and variations will be apparent to those skilled in the art.

Figure 1:
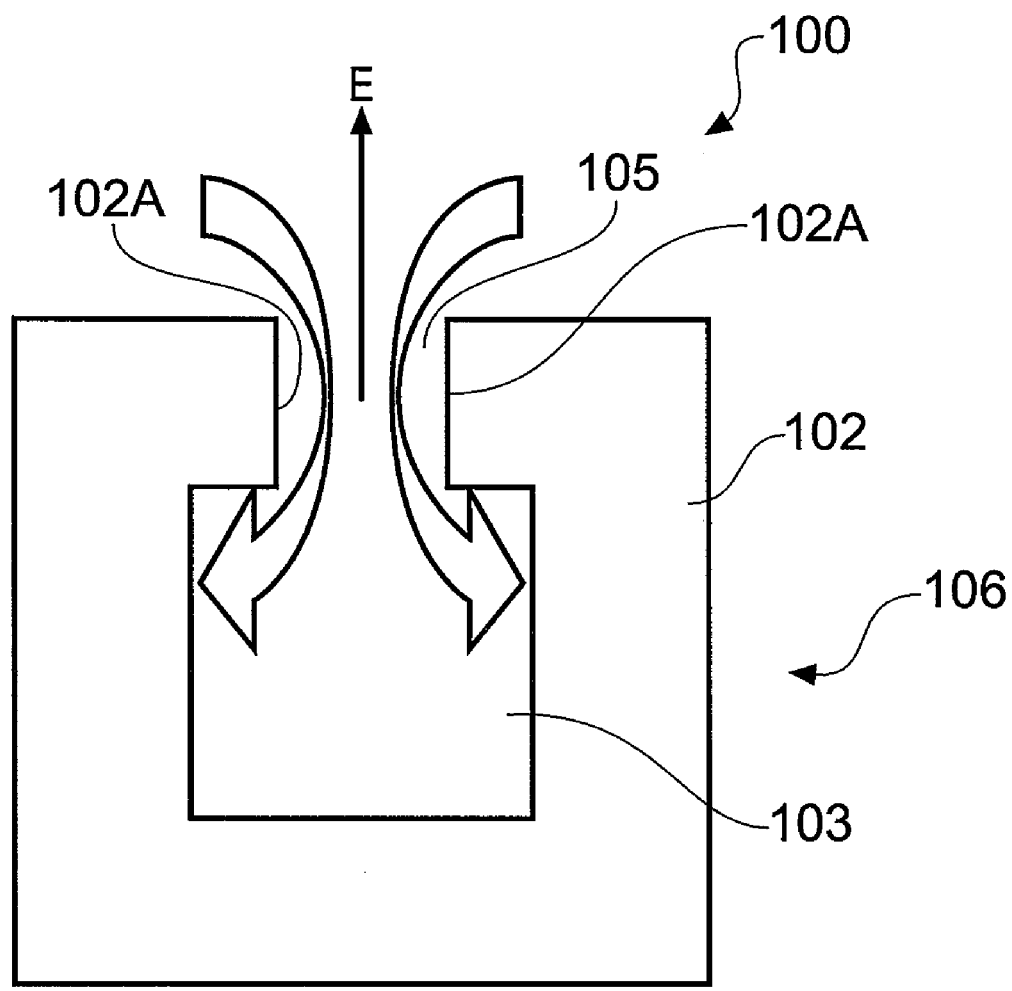
FIGS. 1 and 2 show a fluid trap according to an embodiment of the invention.
Figure 2:
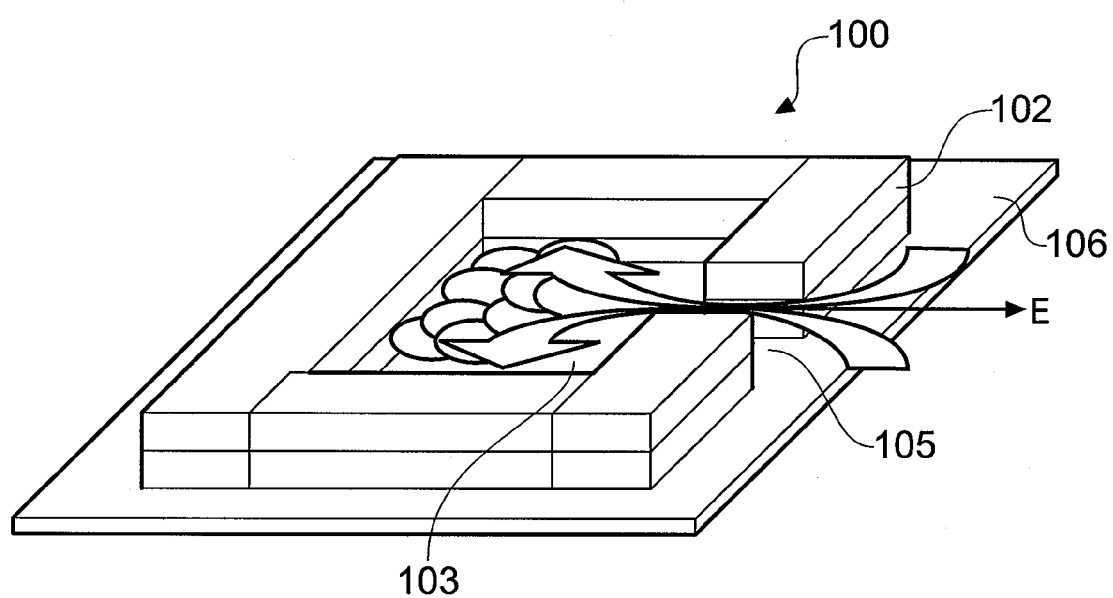

FIGS. 1 and 2 show a fluid trap 100 according to an embodiment of the invention. The trap has a wall 102 generally in the form of a 'C' shape, surrounding a base region 103. An opening 105 is provided in the wall to allow fluid to flow into and out from the trap. A lateral exit flow direction illustrated by arrow E may be defined as a direction between and substantially perpendicular to ends 102A of the wall, and directed away from the base region 103.

Walls of fluid traps are formed at the same time as the feature pattern of the photomask. It will be appreciated that in some embodiments of the invention the walls may be formed in a separate process performed before or after the feature pattern of the photomask is formed.

In the case of photomasks having chrome layers, the wall 102 is formed from a chrome layer deposited in the course of forming the feature pattern on the photomask.

In the case of photomasks having phase shift layers, the wall 102 may be formed from a layer of phase shift material in addition to or instead of a layer of chrome.

Figure 3:
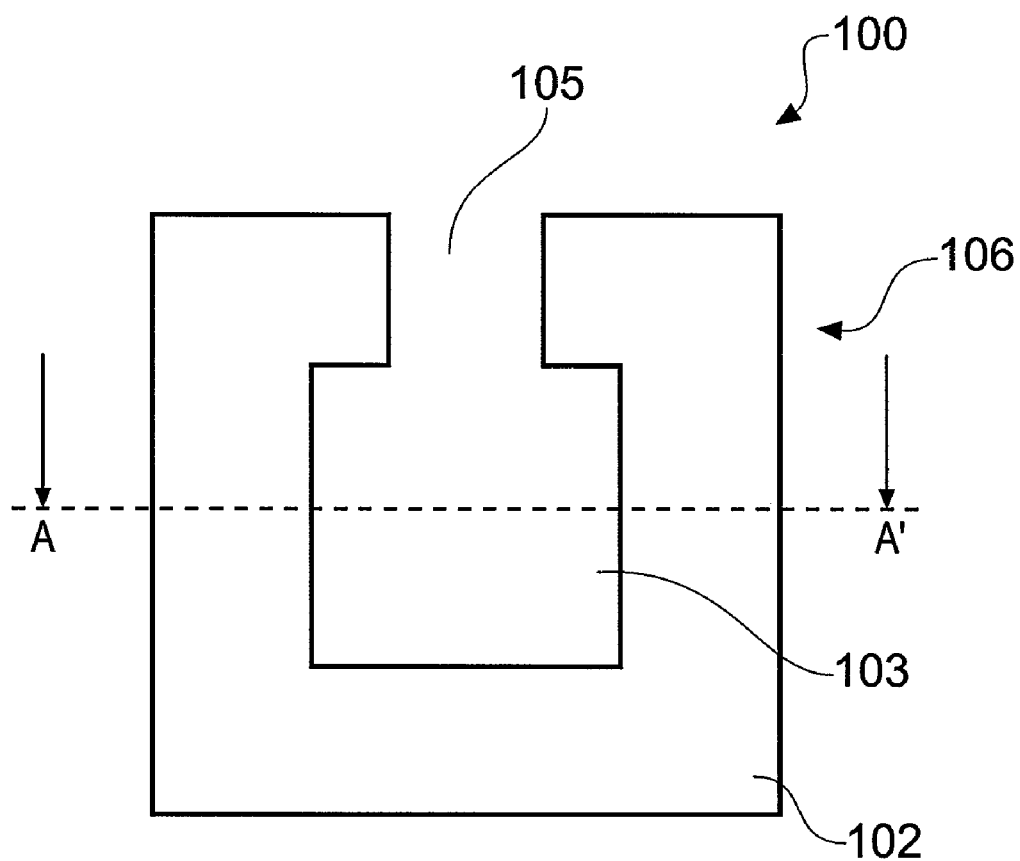
FIGS. 3 and 4 show a fluid trap having a recessed base according to another embodiment of the invention.
Figure 4:
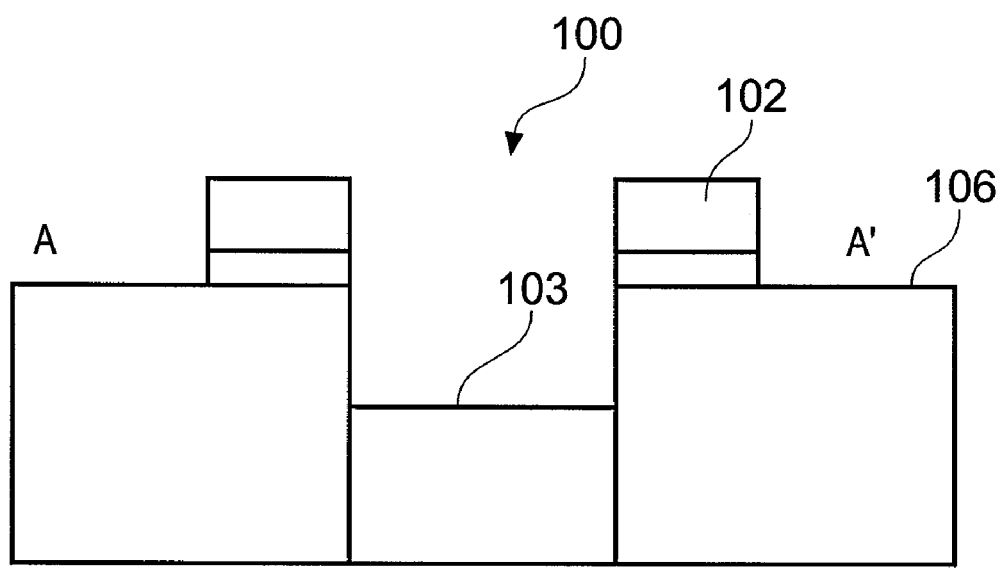

FIGS. 3 and 4 show a fluid trap having a recessed base according to another embodiment of the invention. In FIG. 3 and FIG. 4, the base region 103 is recessed below the level of the photomask surface 106. A recessed base region 103 results in an increase in the amount of fluid that may be trapped by the fluid trap 100. In some embodiments of the invention having recessed base regions 103, the recessed base regions 103 are formed at the same time as recessed regions associated with the feature pattern of the photomask.

Figure 5:
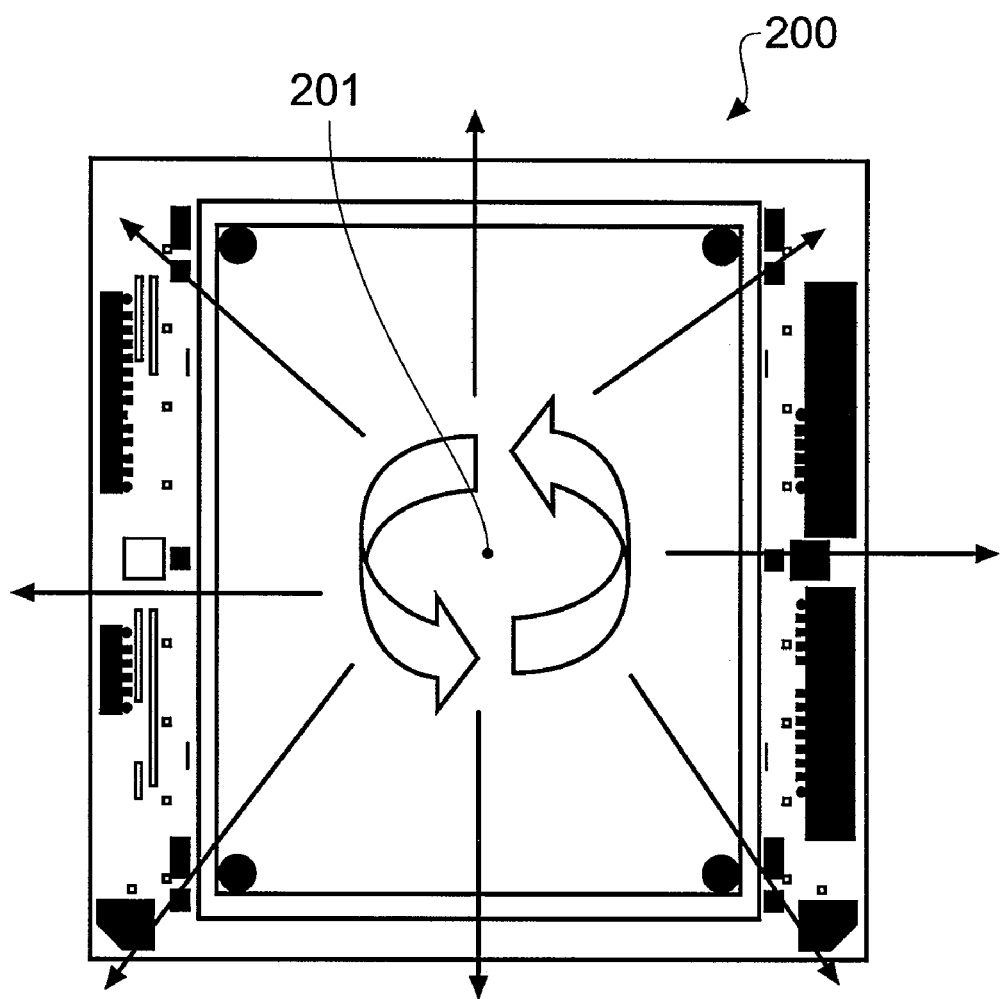
FIG. 5 shows a direction of fluid flow over a photomask during a spin-drying process.

FIG. 5 shows a direction of fluid flow over a photomask during a spin-drying process. A fluid trap 100 has the characteristic that fluid may be drained from an appropriately oriented fluid trap 100 when the photomask 200 is subjected to a spin-drying process. In a spin-dying process, illustrated in FIG. 5, the mask 200 is spun about a central axis 201 of the photomask, perpendicular to the plane of the photomask. An appropriately oriented trap in the case of a spin-drying process is a trap having a lateral exit flow direction oriented in a direction away from the central axis 201 of the photomask. Traps 100 not oriented to allow fluid to flow out of the trap during a spin-drying process will retain fluid for longer periods of time than traps that do allow fluid to flow out during the spin-drying process. A greater amount of contaminants from the cleaning fluid will form in those traps that retain fluid for longer periods of time, the contaminants being deposited in the traps due to evaporation of the solvent component of the fluid remaining in the trap.

Figure 6:
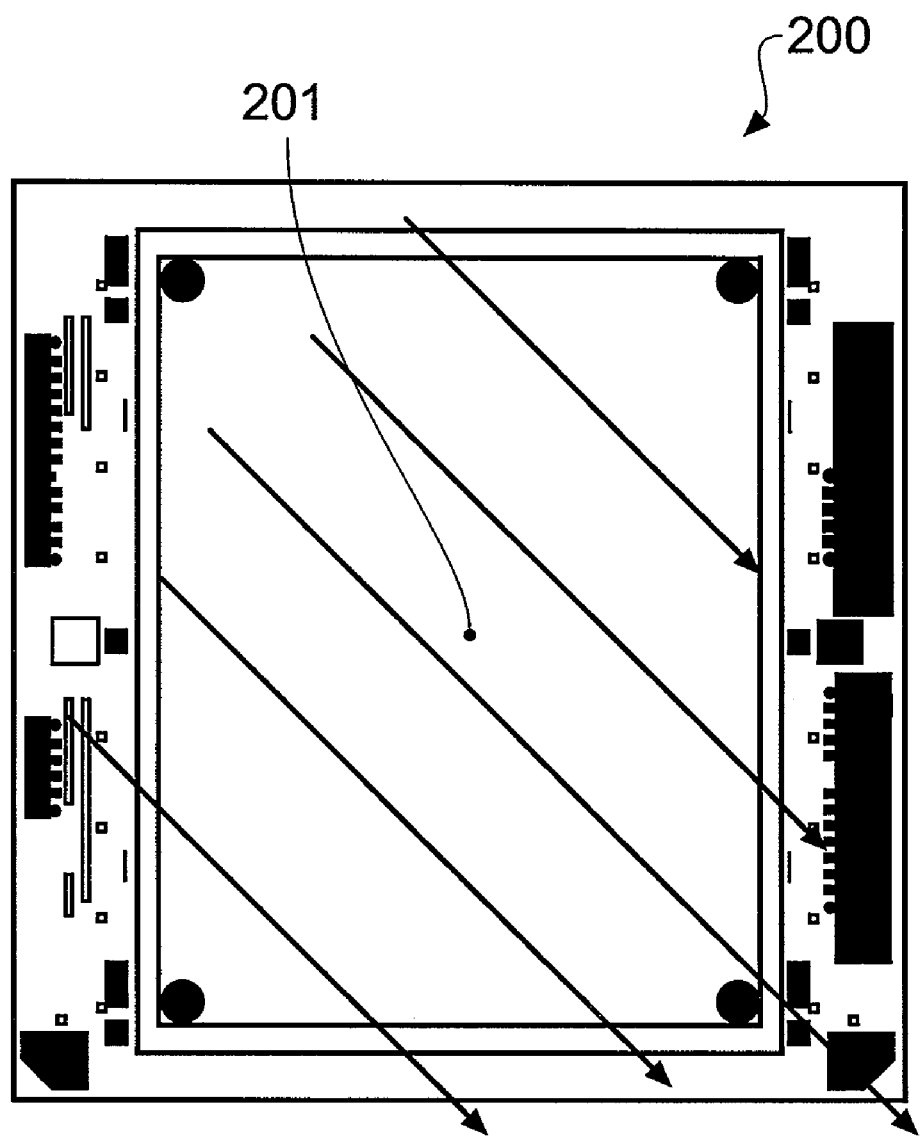
FIG. 6 shows a direction of fluid flow over a photomask during a drip-drying process.

FIG. 6 shows a direction of fluid flow over a photomask during a drip-drying process. Fluid may also be drained from an appropriately oriented trap 100 under gravity if the photomask 200 is tilted following cleaning, for example during a drip-drying process. This is illustrated more clearly in FIG. 6. An appropriately oriented trap in the case of a drip-drying process is a trap having a lateral exit flow direction oriented in a downward direction during the drying process.

Traps 100 not oriented to allow fluid to flow out of the trap during a drip-drying process will retain fluid for longer periods of time than traps that do allow fluid to flow out during the drip-drying process. A greater amount of contaminants from the cleaning fluid will therefore remain in those traps that retain fluid for longer periods of time.

Figure 7:
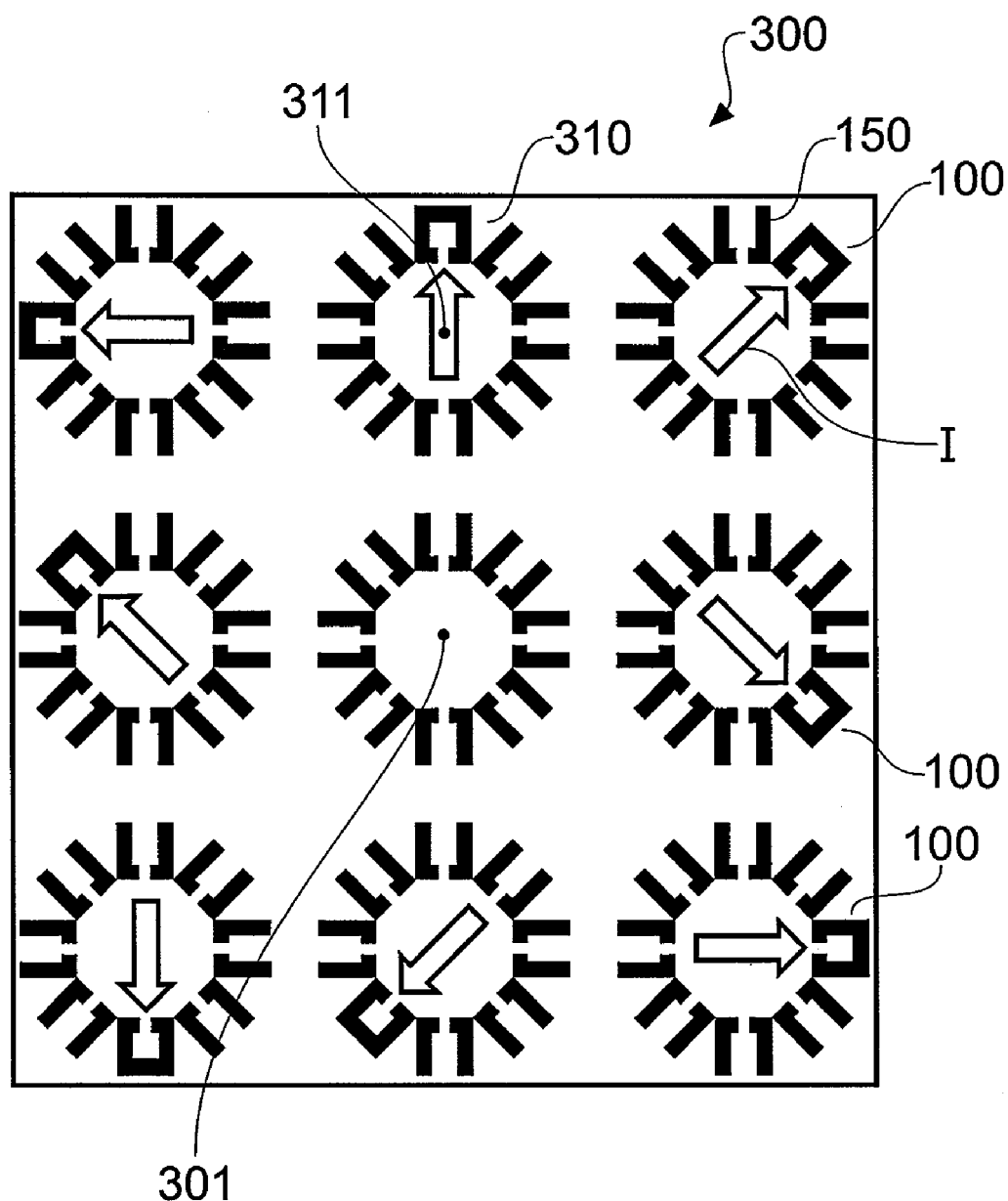
FIG. 7 shows an array of fluid traps according to an embodiment of the invention.

FIG. 7 shows an array 300 of fluid trap cells 310 formed on a photomask 200 in accordance with an embodiment of the invention. Nine cells 310 are provided in a 3×3 square array of cells 300. The cells 310 each comprise seven partial fluid traps 150 and one complete fluid trap 100, the traps being spaced at substantially equal angular intervals about a central axis 311 of the cell 310 normal to the photomask surface. Each trap 100 and partial trap 150 has a lateral exit flow direction oriented towards the central axis 311 of the cell in a direction opposite to that of arrows I as shown in FIG. 7. Arrows I show a lateral fluid entry flow direction of each trap 100, which points in an opposite direction to the lateral exit flow direction of each trap 100.

The partial fluid traps 150 are similar to the complete fluid traps 100 except that a portion of the wall of the partial fluid trap on an opposite side of the structure to the opening 105, is absent.

The cell 301 at the centre of the array does not have a complete fluid trap feature 100. Rather, it comprises eight partial fluid traps 150. It will be appreciated that in some embodiments of the invention the partial fluid trap features 150 are not formed on the photomask. Instead, only the complete fluid traps 100 are formed.

The array of fluid trap cells 310 is provided such that each complete fluid trap 100 has a lateral exit flow direction that is different from the lateral exit flow direction of the other complete fluid traps 100 of the array 300, as shown in FIG. 7.

Furthermore, as shown in FIG. 7, in some embodiments of the invention the cells 310 of a given array 300 are provided with complete fluid traps at respective locations such that an imaginary line drawn along the lateral exit flow direction of each trap, starting within the trap, does not pass through a complete fluid trap 100 of a cell of that particular array. Thus, interference of a complete fluid trap 100 of an array with the flow of fluid into or out from another complete fluid trap 100 of the same array is reduced.

In some embodiments of the invention an array 300 is provided at several locations of the photomask 200 in order to enable a distinction to be made between contamination formed due to a spin-drying process and contamination formed due to a drip-drying process.

Figure 8:
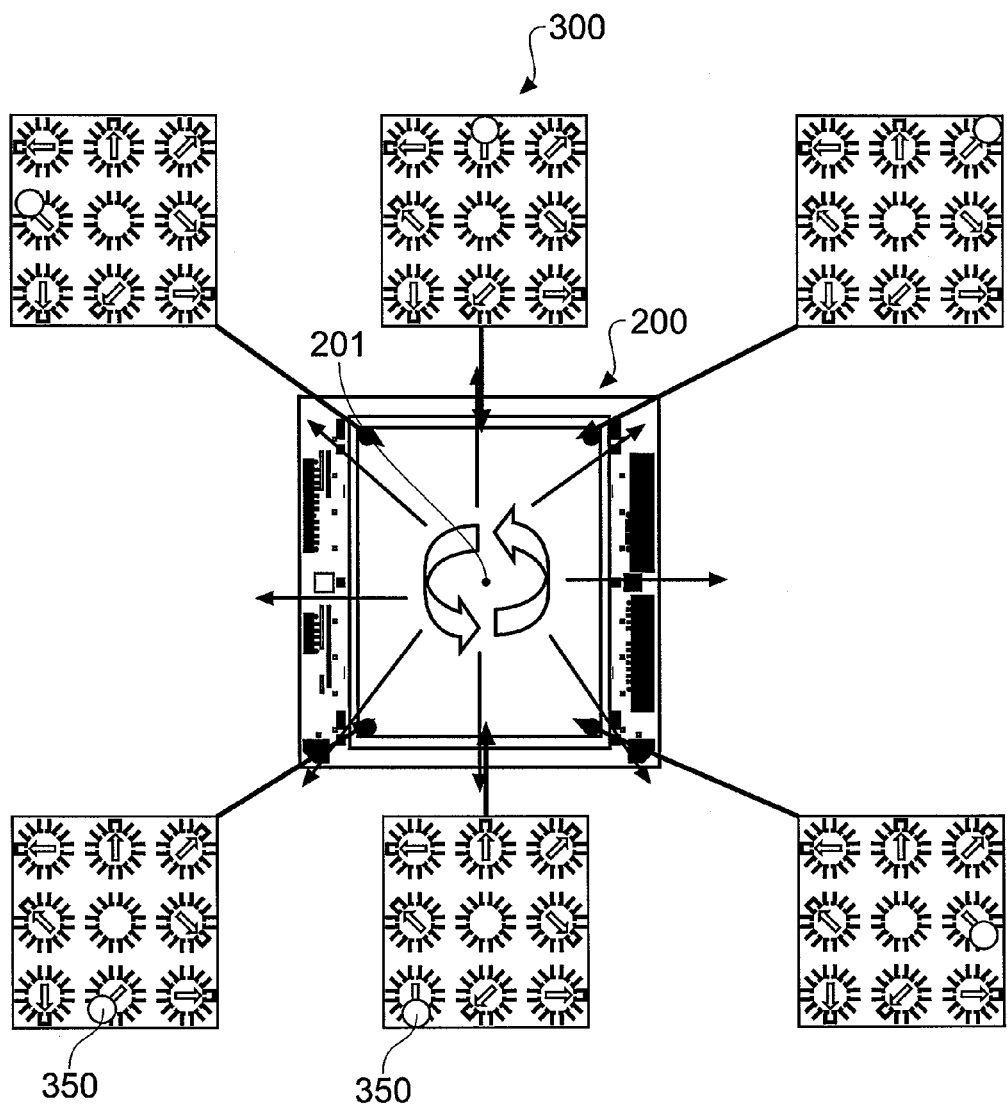
FIG. 8 shows regions of contaminant buildup due to spin-drying of a photomask having a plurality of arrays of fluid traps provided at respective locations.

FIG. 8 shows a photomask 200 in which six arrays 300 of fluid traps 100 are provided. Arrays 300 are provided at each of four corners of the mask, and at two locations midway between the corners, on opposite sides of the central axis 201 of the mask 200. These positions have been found experimentally to be helpful in determining whether a build-up of contaminants is due to a drip-drying process or a spin-drying process.

A distinction between a drip-drying process and a spin-drying process may be made by inspecting the fluid traps 100 to determine in which of the fluid traps 100 a build up of contaminants 350 has occurred. The build-up of contaminants may not be detectable following a single cleaning process. Thus, the mask may require inspection following each of several cleaning processes before detectable levels of contamination accumulate.

A cleaning process prior to use typically comprises the steps of washing the mask in a cleaning fluid, followed by drying of the mask. Drying of the mask is typically performed either by spinning the mask about the central axis 201 of the mask 200, or by tilting the mask from a substantially horizontal orientation to enable cleaning fluid to flow from the mask under gravity. Washing of the mask may include subjecting the mask 200 to an ultrasonic cleaning process.

Inspection of the fluid traps following the selected drying process may be made by eye, or by using an inspection tool.

If the build-up of contaminants 350 has occurred due to evaporation of fluid trapped following a spin-drying process, the traps in which the build-up of contaminants 350 has occurred are likely to be those corresponding to the traps shown in FIG. 8, ie contamination builds up in those traps having lateral exit flow directions oriented in a direction against the flow of cleaning fluid under centrifugal force, which is generally in a direction away from the axis of rotation 201 of the mask.

Figure 9:
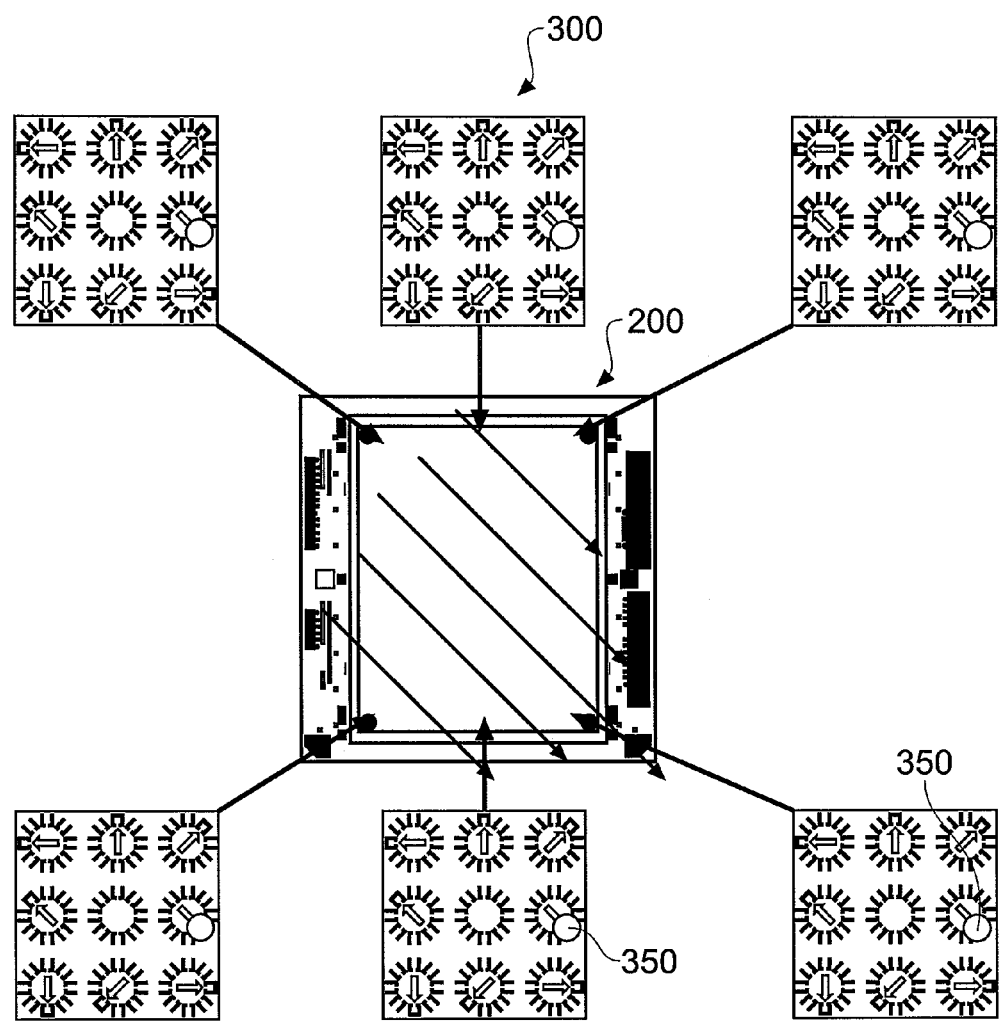
FIG. 9 shows regions of contaminant buildup due to drip-drying of a photomask having a plurality of arrays of fluid traps provided at respective locations.

If the build-up of contaminants 350 has occurred due to evaporation of fluid trapped following a drip-drying process, the traps in which the build-up of contaminants 350 has occurred are likely to be those corresponding to the traps shown in FIG. 9, which are again those traps having lateral exit flow directions oriented in a direction against the flow of cleaning fluid during the drying process.

Thus, in the case of a mask subjected to both spin-drying and drip-drying, if a build-up of contaminants 350 is primarily due to only one of either spin-drying or drip-drying, inspection of the locations of traps in which a build-up of contaminants has occurred will provide an indication of the origin of the contamination. If both drying techniques are responsible for contamination build-up, this will again become apparent from inspection of the locations of traps in which a build-up of contaminants has occurred.

It will be appreciated that several cycles of washing and drying a mask may be required before detectable amounts of contaminant are found in any of the fluid traps. Fluid trapping structures such as those described herein enable a rate of accumulation of contaminants at predetermined regions of a photomask to be accelerated. A level of contaminants in a fluid trap corresponding to a critical level of contaminants on the surface of the photomask leading to a risk of unacceptable levels of device yield may be empirically determined. When a level of contaminants in a fluid trap of a photomask is found to equal or exceed this critical level, the mask may be withdrawn from service pending a further clean, or disposal.

The fluid trapping structure provides a structure capable of trapping fluid on a photomask. The term comprises within its meaning an intersection between a vertical wall formation and a major face of the photomask. For example, a plurality of non-interconnected, discrete walls of respective orientations about a central axis may be provided on a major face of the photomask. The walls may be arranged to trap fluid flowing in particular directions or ranges of directions across the photomask thereby to allow a distinction to be made between a mask that has been drip-dried and a mask that has been spun-dried.

Within the meaning of the word 'contaminants' is included 'haze' and other forms of contamination.

It is an aspect of the present invention to at least partly mitigate at least one of the above-mentioned problems.

It is a further aspect of embodiments of the invention to provide a monitoring structure for a photomask.

Another aspect of embodiments of the present invention is to provide a method for monitoring haze growth on a photomask.

In a first aspect of the present invention there is provided apparatus for determining presence of contamination on a lithography mask, comprising: a fluid trap, the fluid trap comprising: a base and at least one wall member extending substantially perpendicularly to the base for trapping fluid on a portion of the base when fluid introduced during a cleaning process of the mask is removed.

In a second aspect of the present invention there is provided apparatus for determining presence of contamination on a lithography mask, comprising: a fluid trap, the fluid trap comprising: a base and at least one wall member extending substantially perpendicularly to the base for trapping fluid on a portion of the base when fluid introduced during a cleaning process of the mask is removed, wherein the fluid trap further comprises at least one wall member comprising a wall member opening, the wall member opening being configured to allow fluid to flow out of the trap in a lateral exit flow direction of the trap.

In a third aspect of the present invention there is provided apparatus for determining presence of contamination on a lithography mask, comprising: a plurality of fluid traps, each fluid trap comprising: a base and at least one wall member extending substantially perpendicularly to the base for trapping fluid on a portion of the base when fluid introduced during a cleaning process of the mask is removed, wherein the fluid trap further comprises at least one wall member comprising a wall member opening, the wall member opening being configured to allow fluid to flow out of the trap in a lateral exit flow direction of the trap.

In a fourth aspect of the present invention there is provided apparatus for determining presence of contamination on a lithography mask, comprising: a cluster of fluid traps, each fluid trap comprising: a base and at least one wall member extending substantially perpendicularly to the base for trapping fluid on a portion of the base when fluid introduced during a cleaning process of the mask is removed, wherein the fluid trap further comprises at least one wall member comprising a wall member opening, the wall member opening being configured to allow fluid to flow out of the trap in a lateral exit flow direction of the trap, lateral exit flow directions of respective traps being spaced at intervals of between substantially 10 and 180 degrees about a mask surface normal.

In a fifth aspect of the present invention there is provided a method of monitoring a buildup of contaminants on a lithography mask comprising the steps of: providing a mask having at least one fluid trap, the fluid trap comprising a base and at least one wall member extending substantially perpendicularly to the base for trapping fluid on a portion of the base when fluid introduced during a cleaning process of the mask is removed; washing said mask in a cleaning fluid; drying said mask; and measuring an amount of contaminants in said at least one trap.

In a sixth aspect of the present invention there is provided a method of forming a lithography mask comprising: forming at least one fluid trap on a surface of a lithography mask, the step of forming the at least one fluid trap comprising the steps of forming at least one wall member extending substantially perpendicularly to a base whereby the wall member is for trapping fluid on a portion of the base when fluid introduced during a cleaning process of the mask is removed.

Embodiments of the present invention provide fluid trapping structures that accelerate the buildup of contaminants on a photomask within the fluid trapping structures. The buildup of contaminants within a fluid trapping structure, at a position on the photomask which is not critical to device manufacture, provides an indication of a level of contaminants in regions of the photomask outside the fluid trapping structure, such as those areas of the photomask corresponding to features of the integrated circuit.

The level of contaminants in a fluid trapping structure may be correlated with data relating to the yield of working devices produced using the photomask in order to determine a critical level of contaminants in a fluid trap corresponding to a mask that is not fit for service.

These features are useful in assessing the quality of different drying processes. They are also useful in determining the drying history of a mask.

Different embodiments of the present invention will have some, all, or none of the above aspects and features described above.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. Apparatus for determining presence of contamination on a lithography mask, comprising:
   a fluid trap on the lithography mask, the fluid trap comprising:
   a base and at least one wall member extending substantially perpendicularly to the base for trapping fluid on a portion of the base when fluid introduced during a cleaning process of the mask is removed.

2. The apparatus as claimed in claim 1 wherein the fluid trap further comprises at least one wall member comprising a wall member opening, the wall member opening being configured to allow fluid to flow out of the trap in a lateral exit flow direction of the trap.

3. The apparatus as claimed in claim 2 comprising a plurality of fluid traps.

4. The apparatus as claimed in claim 3 wherein a cluster of traps is provided, lateral exit flow directions of respective traps being spaced at intervals of between substantially 10 and 180 degrees about a mask surface normal.

5. The apparatus as claimed in claim 4 wherein said exit flow directions are spaced at intervals of between substantially 10 and 100 degrees about the mask surface normal.

6. The apparatus as claimed in claim 5 wherein a plurality of clusters is provided at respective locations on a surface of a mask.

7. The apparatus as claimed in claim 1 wherein the at least one wall member is generally 'C' or 'U' shaped.

8. The apparatus as claimed in claim 1 wherein at least a portion of the base is below a surface of the mask.

9. The apparatus as claimed in claim 1 wherein the wall member comprises at least a portion formed above the surface of the mask.

10. Apparatus for determining presence of contamination on a lithography mask, comprising:
a plurality of fluid traps on the lithography mask, each fluid trap comprising:
a base and at least one wall member extending substantially perpendicularly to the base for trapping fluid on a portion of the base when fluid introduced during a cleaning process of the mask is removed, wherein the fluid trap further comprises at least one wall member comprising a wall member opening, the wall member opening being configured to allow fluid to flow out of the trap in a lateral exit flow direction of the trap.

11. Apparatus for determining presence of contamination on a lithography mask, comprising:
a cluster of fluid traps on the lithography mask, each fluid trap comprising:
a base and at least one wall member extending substantially perpendicularly to the base for trapping fluid on a portion of the base when fluid introduced during a cleaning process of the mask is removed, wherein the fluid trap further comprises at least one wall member comprising a wall member opening, the wall member opening being configured to allow fluid to flow out of the trap in a lateral exit flow direction of the trap, lateral exit flow directions of respective traps being spaced at intervals of between substantially 10 and 180 degrees about a mask surface normal.

* * * * *